United States Patent
Hobart et al.

(10) Patent No.: US 9,196,703 B2
(45) Date of Patent: Nov. 24, 2015

(54) SELECTIVE DEPOSITION OF DIAMOND IN THERMAL VIAS

(71) Applicants: Northrop Grumman Systems Corporation, Falls Church, VA (US); The United States of America, as Represented by the Secretary of the Navy, Washington, DC (US); The Regents of the University of California, Oakland, CA (US)

(72) Inventors: Karl D. Hobart, Upper Marlboro, MD (US); Tatyana I. Feygelson, Springfield, VA (US); Eugene I. Imhoff, Washington, DC (US); Travis J. Anderson, Alexandria, VA (US); Joshua D. Caldwell, Accokeek, MD (US); Andrew D. Koehler, Washington, DC (US); Bradford B. Pate, Arlington, VA (US); Marko J. Tadjer, Virginia Beach, VA (US); Rajinder S. Sandhu, Castaic, CA (US); Vincent Gambin, Torrance, CA (US); Gregory Lewis, Tustin, CA (US); Ioulia Smorchkova, Lakewood, CA (US); Mark Goorsky, Valencia, CA (US); Jeff McKay, Rowland Heights, CA (US)

(73) Assignees: Northrop Grumman Systems Corporation, Falls Church, VA (US); The United States of America, as Represented by the Secretary of the Navy, Washington, DC (US); The Regents of the University of California, Oakland, CA (US)

( * ) Notice: Subject to any disclaimer, the term of this patent is extended or adjusted under 35 U.S.C. 154(b) by 0 days.

(21) Appl. No.: 14/464,406

(22) Filed: Aug. 20, 2014

(65) Prior Publication Data
US 2015/0056763 A1 Feb. 26, 2015

Related U.S. Application Data

(60) Provisional application No. 61/868,736, filed on Aug. 22, 2013.

(51) Int. Cl.
*H01L 29/66* (2006.01)
*H01L 21/02* (2006.01)
(Continued)

(52) U.S. Cl.
CPC ...... *H01L 29/66462* (2013.01); *H01L 21/0217* (2013.01); *H01L 21/0254* (2013.01);
(Continued)

(58) Field of Classification Search
CPC ............ H01L 21/02115; H01L 23/3732; H01L 21/76802; H01L 29/66462; H01L 21/3065; H01L 21/0254; H01L 21/0217; H01L 21/02164; H01L 21/31122; H01L 23/367; H01L 23/3677; H01L 29/1602; H01L 29/2003; H01L 29/778
See application file for complete search history.

(56) References Cited

U.S. PATENT DOCUMENTS

| 4,425,195 A | 1/1984 | Papanicolaou |
| 7,745,848 B1 | 6/2010 | Rajagopal et al. |
| 8,575,657 B2 | 11/2013 | Gambin et al. |

FOREIGN PATENT DOCUMENTS

WO 2012/050157 A1 4/2012

*Primary Examiner* — Latanya N Crawford
(74) *Attorney, Agent, or Firm* — John A. Miller; Miller IP Group, PLC

(57) ABSTRACT

A method for fabricating a semiconductor device, such as a GaN high electron mobility transistor (HEMT) device, including etching a thermal via into a back-side of a semiconductor substrate and depositing a diamond nucleation seed layer across the back-side of the substrate. The method further includes coating the diamond nucleation with a mask layer and removing mask material outside of the thermal via on the planar portions of the back-side of the substrate. The method includes removing portions of the diamond nucleation layer on the planar portions and then removing the remaining portion of the mask material in the thermal via. The method then includes depositing a bulk diamond layer within the thermal via on the remaining portion of the diamond nucleation layer so that diamond only grows in the thermal via and not on the planar portions of the substrate.

20 Claims, 3 Drawing Sheets

(51) Int. Cl.
*H01L 21/3065* (2006.01)
*H01L 21/311* (2006.01)
*H01L 21/768* (2006.01)
*H01L 23/373* (2006.01)
*H01L 23/367* (2006.01)
*H01L 29/16* (2006.01)
*H01L 29/20* (2006.01)
*H01L 29/778* (2006.01)

(52) U.S. Cl.
CPC .... *H01L21/02115* (2013.01); *H01L 21/02164* (2013.01); *H01L 21/3065* (2013.01); *H01L 21/31122* (2013.01); *H01L 21/76802* (2013.01); *H01L 23/367* (2013.01); *H01L 23/3677* (2013.01); *H01L 23/3732* (2013.01); *H01L 29/1602* (2013.01); *H01L 29/2003* (2013.01); *H01L 29/778* (2013.01); *H01L 2924/0002* (2013.01)

SELECTIVE DEPOSITION OF DIAMOND IN THERMAL VIAS

CROSS-REFERENCE TO RELATED APPLICATIONS

This application claims the benefit of the filing date of provisional application Ser. No. 61/868,736, titled, Selective Deposition of Diamond in Thermal Vias, filed Aug. 22, 2013.

GOVERNMENT CONTRACT

This invention was made with government support under Contract Number HR001-09-C-0132 awarded by the Defense Advanced Projects Research Agency. The government has certain rights in the invention.

BACKGROUND

1. Field

This invention relates generally to a method for fabricating a semiconductor device and, more particularly, to a method for fabricating a GaN semiconductor device that includes selectively depositing diamond within a thermal via in a backside of a substrate of the device.

2. Discussion

Integrated circuits are typically fabricated by epitaxial fabrication processes that deposit or grow various semiconductor layers on a wafer substrate to provide the circuit components for the device. Substrates for integrated circuits can include various materials, usually semiconductor materials, such as silicon, sapphire, SiC, InP, GaAs, etc. As integrated circuit fabrication techniques advance and become more complex, more circuit components are able to be fabricated on the substrate within the same area and be more closely spaced together. Further, these integrated circuit fabrication techniques allow the operating frequencies of the circuit to increase to very high frequencies, well into the GHz range.

Virtually all electronic components operate in a thermally limited capacity, that is, the performance of the device is limited by the amount of heat that can be dissipated to the environment. The amount of thermal dissipation is proportional to the operating voltages, currents and frequencies of the device, where any increase results in higher power dissipation and thus waste heat. The rise of the electronic device junction temperature in the device is proportional to the thermal resistance between the device channel or junctions and the point at which the heat is released to the environment. Every device has a maximum junction temperature, where operation of the device beyond that temperature results in diminished performance and reliability due to basic limitations of the semiconductor and packaging materials. The desire to operate at higher powers (voltage, current, and/or frequency) drives the need for a reduction in thermal resistance. One example includes microprocessors having clock frequencies that have leveled out and increased processing capability has been enabled by expanding the number of processing cores.

Another example includes gallium nitride (GaN)-based RF and microwave power amplifiers. GaN is a wide bandgap semiconductor and GaN-based high electron mobility transistors (HEMTs) have the ability to operate at both high current and high voltage. This type of operation coupled with fine geometries results in megawatt per square centimeter ($MW/cm^2$) power densities near the gate finger of the device. GaN HEMT devices are typically epitaxial grown on a suitable substrate for these applications, where the substrate needs to be highly thermally conductive, electrically insulative, have a thermal expansion coefficient similar to GaN and provide lattice constant matching for suitable epitaxial growth. Suitable materials that are both highly thermally conductive and electrically insulative are relatively unique. The high power dissipation leads to reduced performance due to 'self-heating' effects and also limits the long term reliability due to high junction temperatures.

A high thermally conductive substrate for these devices is necessary so that heat is removed from the device junction through the epitaxial layers and the substrate so that the device is able to operate at high power in a reliable manner. Particularly, as mentioned above, as the temperature of the device increases above some threshold temperature, the electrical performance of the device is reduced, which reduces its high power capability. Further, too high of a temperature within the device reduces its reliability because its time to failure will be reduced. Also, these types of devices are typically high frequency devices, which become smaller in size as the frequency increases, which reduces their ability to withdraw heat. The conductive path for heat generated at the device junction layer in an HEMT device causes the heat to propagate through the epitaxial layers and the substrate and into the device packaging. Therefore, it necessary to provide a high thermally conductive substrate that does not impede the path of the heat exiting the device, and allows the heat to spread out over a larger area. The thickness of the substrate is optimized to provide a low resistance heat path into the packaging from the device and provide the ability to spread the heat out away from the device.

Previously, GaN was grown on sapphire, which has poor thermal conductivity and severely limited the available output power. More recently silicon carbide (SiC) has replaced sapphire as a substrate for GaN. For GaN HEMT devices, silicon carbide (SiC) substrates are currently the industry standard for providing the desirable characteristics of electrically insulating, highly thermally conductive, a close lattice match to that of GaN and a similar thermal expansion coefficient to that of GaN. SiC has a much higher thermal conductivity, but the power dissipation is still limited by thermal constraints and the devices are not allowed to perform at their maximum levels. Although SiC is a good thermal conductor, its thermal conductivity is still limited, and as the junction temperature rises in the device, the ability of the SiC substrate to remove the heat is limited, which limits the output power of GaN HEMT devices, and subsequently their reliability, as discussed above.

It is desirable to provide a suitable substrate for a GaN HEMT device that has a greater thermal conductivity than SiC. Diamond is electrically insulating and has the highest thermal conductivity of any bulk material. However, it is currently not possible to epitaxial grow GaN layers on large area single-crystal diamond substrates for many reasons, including availability, a large lattice constant mismatch and different thermal expansion coefficients.

Efforts have been made in the industry to overcome these problems so as to use diamond substrates in a semiconductor device, such as GaN HEMT devices. For example, it is known in the art to remove the SiC substrate, or other substrate, that the GaN layers can effectively be grown on, and then bond a diamond substrate to the device using a bonding layer. However, there is now a bonding layer of some thickness between the GaN device layers and the diamond substrate that does not have the proper thermal conductivity, and thus affects the ability of heat to be removed from the device through the diamond substrate. Further, because bulk diamond has a low thermal coefficient of expansion, there is still the problem that the difference between the thermal expansion coefficients of the device layers and the substrate causes wafer curvature and possibly epitaxial layer cracking.

Other concepts to improve the thermal conductivity of these types of devices are to replace the substrate altogether with diamond. However, since these diamond substrates are polycrystalline in nature, the GaN must be transferred to diamond substrates or the diamond must be grown on the GaN following removal of the original host substrate. This process is fairly limited due to the large coefficient of thermal expansion (CTE) between GaN and diamond. The CTE mismatch limits the scalability of the process and leads to warped wafers which are not possible to process into transistors.

It is also known in the art to grow diamond on the front-side of the device opposite to the substrate. However, it has been shown that these types of devices have limited improvement in thermal conductivity and heat flow out of the device because heat flow through the substrate is still highly important. Further, GaN layers may not survive the high temperature diamond deposition process, and thus may need to be protected using a thermally resistive layer, which again limits the thermal performance.

Diamond thermal vias have been previously conceived to improve thermal resistance of semiconductor substrates by bringing high thermal conductivity diamond conduits close to the device active area where the heat is most concentrated. A high density of high aspect ratio thermal vias has the advantage of increasing the overall thermal conductivity and power handling of the composite diamond/semiconductor substrate. Large vias with thick diamond filled in the vias is also an attractive approach. Both large and small vias require a selective method to coat and fill the vias to prevent unacceptable wafer bow and potential wafer breakage due to large CTE mismatch.

DETAILED DESCRIPTION OF THE EMBODIMENTS

The following discussion of the embodiments of the invention directed to a method for fabricating GaN semiconductor devices including a diamond filled thermal via extending through a back-side of a substrate of the device is merely exemplary in nature, and is in no way intended to limit the invention or its applications or uses.

The present disclosure describes a method or fabrication process to provide selective deposition of diamond within thermal vias in the back-side of a substrate of a semiconductor device, such as a GaN transistor, to provide an isolated thermal via. FIGS. 1-7 are profile views of a GaN semiconductor device 10 showing progressive fabrication steps for fabricating such a diamond thermal via.

Figure 1:
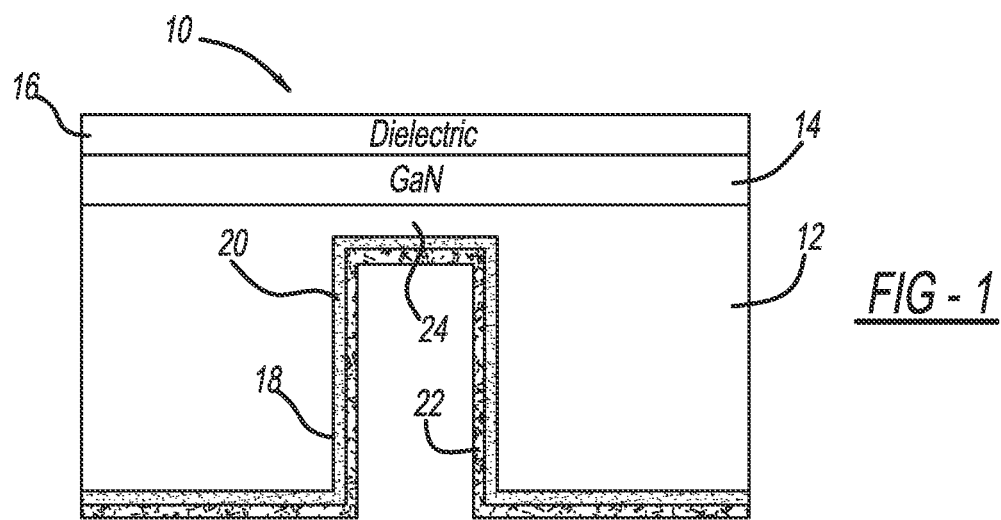
FIGS. 1-7 show progressive fabrication steps of a GaN semiconductor device profile including selectively depositing a diamond thermal via in a backside of a substrate of the device.

FIG. 1 shows the device 10 including an SiC wafer substrate 12 and a number of epitaxial GaN device layers 14 deposited on a front side of the substrate 12 that will later be processed to fabricate, in this non-limiting example, a GaN high electron mobility transistor (HEMT) device, using known epitaxial growth techniques. Although the substrate 12 is a SiC substrate in this non-limiting example, the substrate 12 can be any substrate suitable for the purposes discussed herein, such as sapphire, GaN, AlN, silicon, etc. The epitaxial device layers 14 can be any combination of device layers in any suitable order for an HEMT device, or other semiconductor device, such as a GaN buffer layer, AlN nucleation layer, AlGaN barrier layer, GaN channel layer, etc. Once all of the epitaxial layers 14 have been grown on the substrate 12, the epitaxial layers 14 are protected with a thermally stable protective dielectric layer 16, such as silicon nitride (SiN), silicon dioxide ($SiO_2$), combinations thereof, or other suitable refractory material.

The device 10 is then flipped over and the back-side of the substrate 12 is patterned using a suitable mask (not shown) to provide a deep thermal via 18 by, for example, a dry plasma etching process, well understood by those skilled in the art. It is noted that the etch that forms the thermal via 18 in this non-limiting example does not extend completely through the substrate 12 to the GaN layers 14, but is stopped short of the layers 14 to define a thin substrate layer 24 between the via 18 and the layers 14. The layer 24 can be selectively controlled in thickness for the desired thermal performance. Providing the thin layer 24 of the substrate material may have certain desirable semiconductor properties for HEMT devices. The width or diameter of the via 18 is carefully selected to conform to the area of the transistor device formed on top of the substrate 12 so that the thermal via 18 provides an avenue for removal of waste heat from the transistor device. In one embodiment, each of the transistor devices being formed on the wafer substrate 12 will include a single via of this size, where most of the area of the wafer substrate 12 would not include a thermal via.

The entire backside of the wafer 10 including the via 18 is coated with a thin layer of a nanocrystalline or polycrystalline diamond, referred to herein as a diamond nucleation seed layer 20. In one embodiment, the diamond layer 20 is deposited by, for example, a suitable chemical vapor deposition process to a thickness in the range of 0.0.1-2 μm using known epitaxial processes to form a thin conformal layer without pin holes. Prior to the diamond layer 20 being deposited on the back-side of the substrate 12, the entire wafer substrate 12 is coated with a very thin layer of nano-diamond particles by placing the wafer substrate 12 in a solution including such particles. This minimal thickness layer of nano-diamond particles provides a seed layer to which the diamond nucleation layer 20 can be grown. The diamond layer 20 is then coated with a mask layer 22, for example, $SiO_2$, SiN or other suitable dielectrics, that has a suitable conformal behavior.

Figure 2:
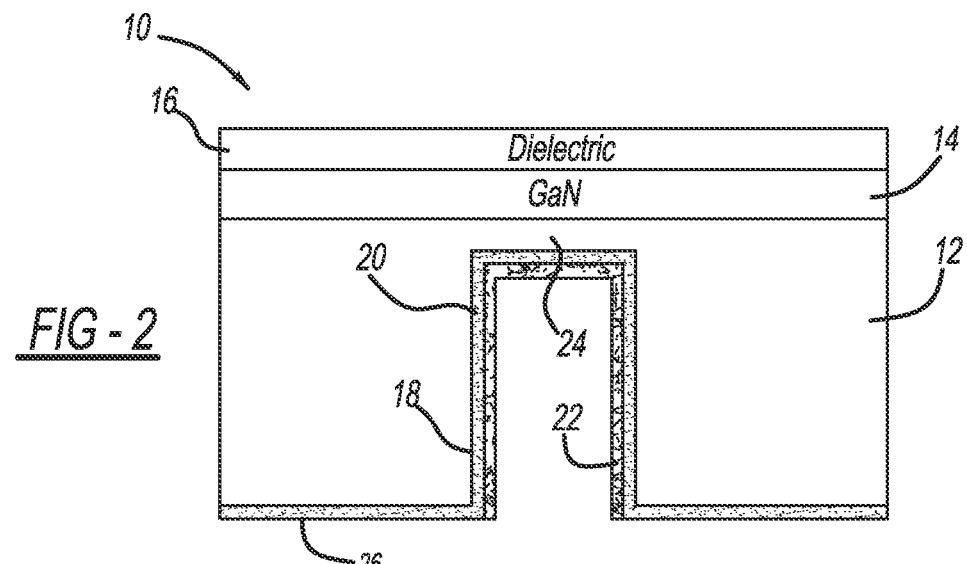

A portion of the mask layer 22 outside of the via 18 in a planar region of the back-side of the substrate 12 is removed from the device 10, as shown in FIG. 2 by, for example, a chemo-mechanical polishing (CMP) process so that only mask material is left in the via 18 to protect the diamond layer 20 therein including the via bottom and side walls. This leaves a remaining planar portion 26 of the diamond layer 20 exposed, as shown. Some of the diamond nucleation layer 20 may be removed at the planar portion 26 of the back-side of the substrate 12 outside of the via 18 during this process of removing a portion of the mask layer 22.

Figure 3:
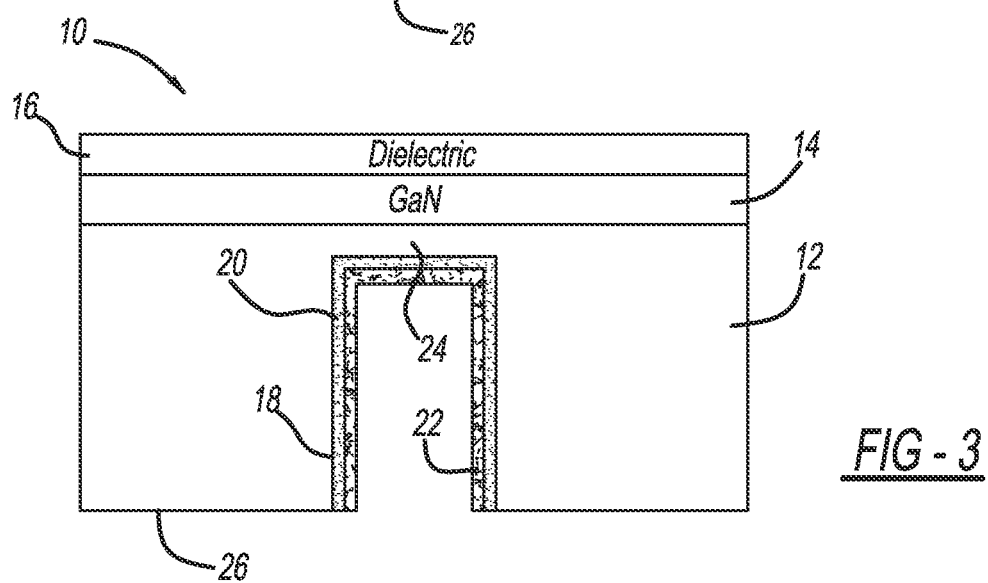
Figure 4:
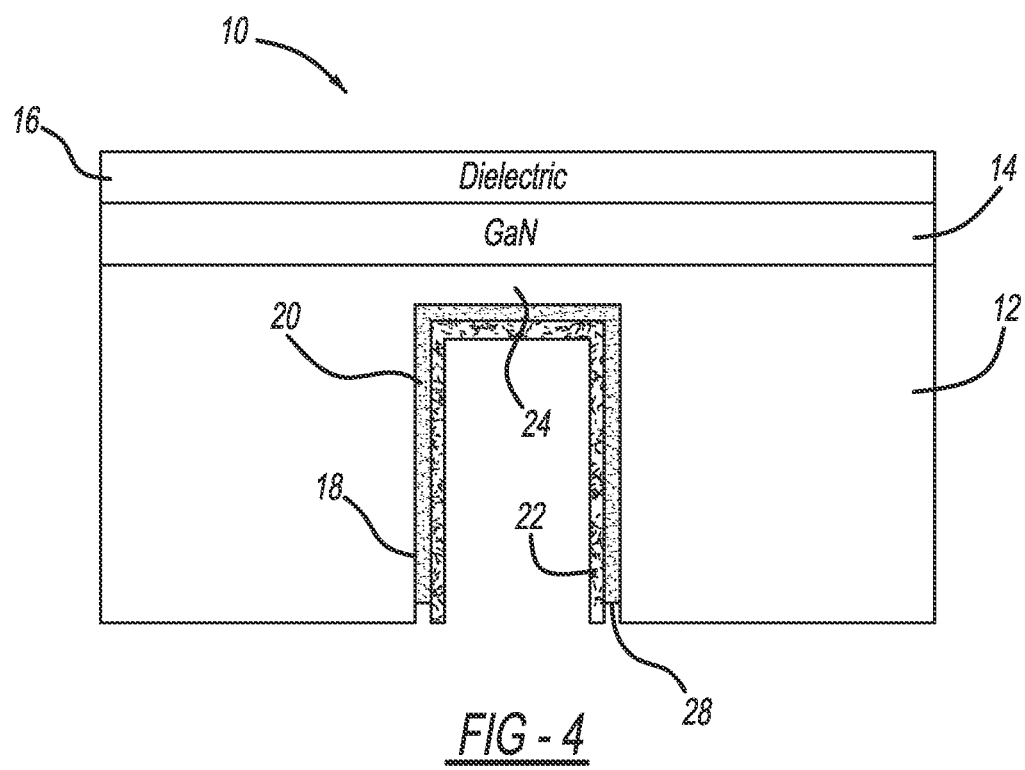

Next, the back-side of the substrate 12 is selectively etched using, for example, a reactive plasma etching process, such as a reactive ion etch with oxygen added to reactive gas stream, to completely remove the planar portion 26 of the diamond layer 20 outside of the via 18, as shown in FIG. 3. The remaining portion of the diamond layer 20 behind the remaining portion of the mask layer 22 in the via 18 can optionally be recessed, as shown in FIG. 4. For example, a high temperature (700° C.) oxidation thermal etch process in a resistively heated tube furnace with flowing oxygen can be performed so that some of the diamond along the side edges of the via 18 can be removed from behind the mask layer 22 to form a recess 28. This step may be advantageous because during the diamond growth process that fills the via 18 with diamond material discussed below, diamond has a tendency to grow faster at edges, which will cause diamond material to "spill out" over the edge of the via 18 and back into the planar portion of the back-side of the substrate 12. Because diamond breaks down at relatively low temperatures, it is possible to use such a high temperature oxidation process to selectively remove the diamond along the sidewalls of the via 18 without effecting the substrate 12 and the mask layer 22. In an alternate embodiment, a single thermal etching step can be performed to both remove the planar portion 26 and create the recess 28. In one non-limiting embodiment, the recess 28 is on the order of 20-30 microns in depth.

Figure 5:
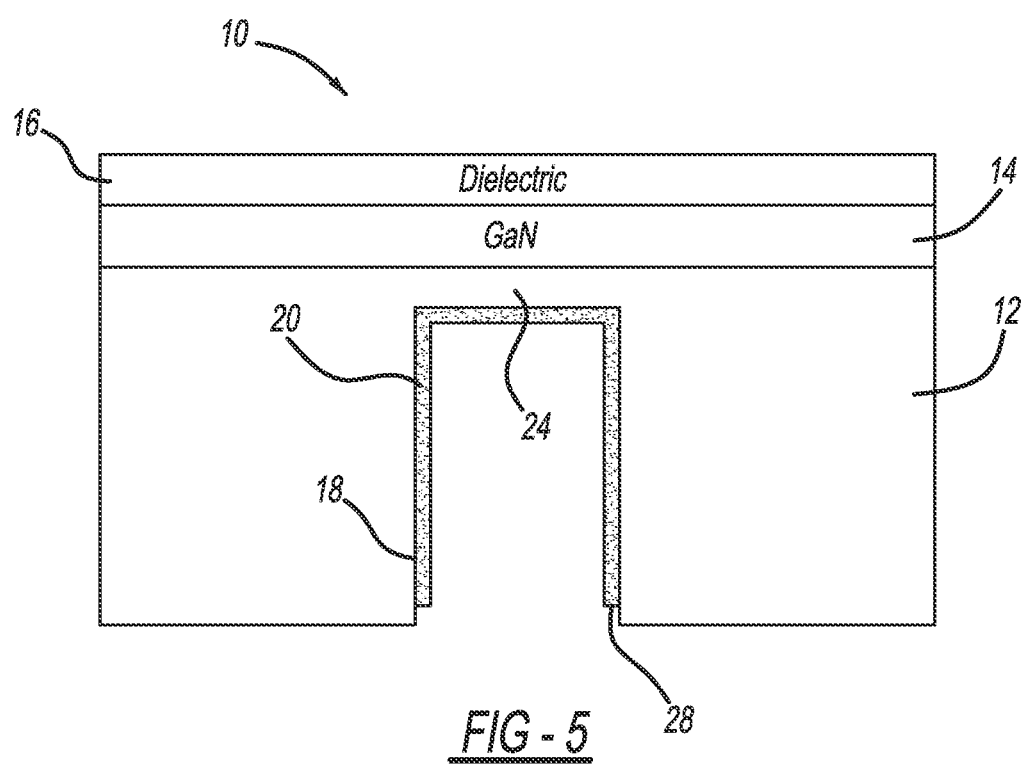

The remaining portion of the mask layer 22 in the via 18 is then removed by selectively etching with a wet or dry etching process, as shown in FIG. 5. In one non-limiting embodiment, if $SiO_2$ is used as the mask material for the mask layer 22, this etching step may be performed in a buffered oxide etch (BOE) containing hydrofluoric acid (HF) that selectively etches the $SiO_2$ and does not etch the diamond layer 20 underneath. In an alternate embodiment, if SiN is used as the mask material, the mask layer 22 can be selectively etched with reactive ion etching in a plasma with the addition of $SF_6$ in the gas stream.

Figure 6:
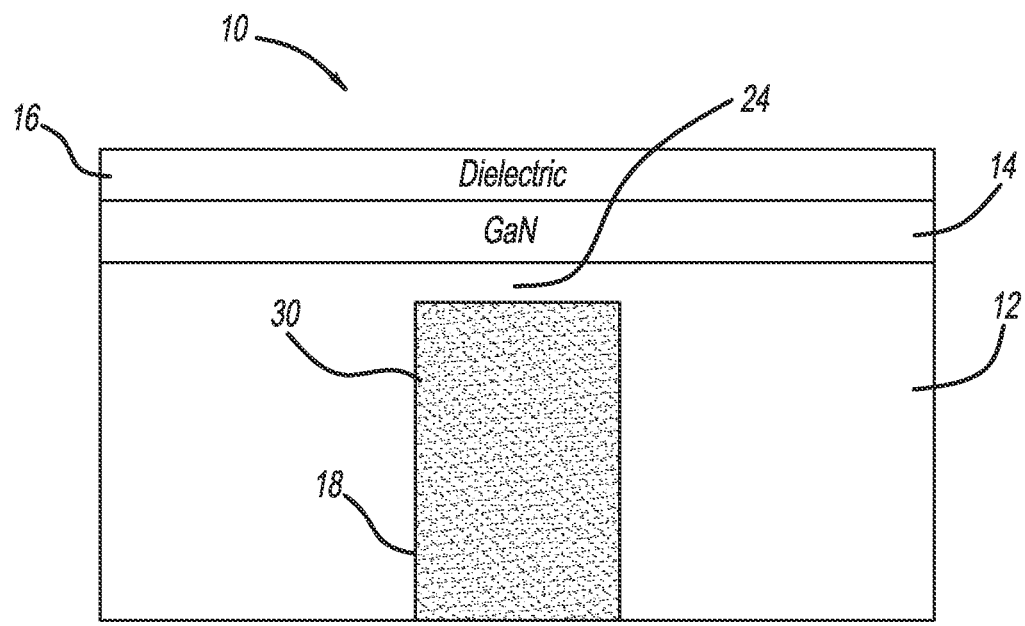

Next, diamond is selectively deposited in the vias 18 in a high diamond growth rate process to fill the via 18 with diamond material to form a thick nanocrystalline or polycrystalline diamond layer 30, as shown in FIG. 6. In this diamond growth process the diamond nucleation layer 20 is used as a seed template for diamond growth of the diamond layer 30. Under optimized conditions, the diamond layer 30 only grows in the via 18 and completely fills the via 18, including the recess 28, where no diamond grows outside of the via 18 because the diamond nucleation layer 20 has been removed from these portions of the back-side of the substrate 12. Although the diamond layer 30 completely fills the via 18 in this embodiment, in other embodiments, it may be desirable to only partially fill the via 18 with the diamond layer 30.

Wafer shaping can also be monitored throughout the process, where the wafer shape is measured initially, after approximately 1 micrometer of initial diamond growth, and after selective removal of the diamond. In this process, wafer bow is highest after diamond re-growth, but is minimized after selective removal of the diamond demonstrating the key advantage of the process. The quality of the diamond layer 30 in the via 18 can be examined by removing the substrate 12 through etching by Raman spectroscopy to compare the material quality at various points.

Figure 7:
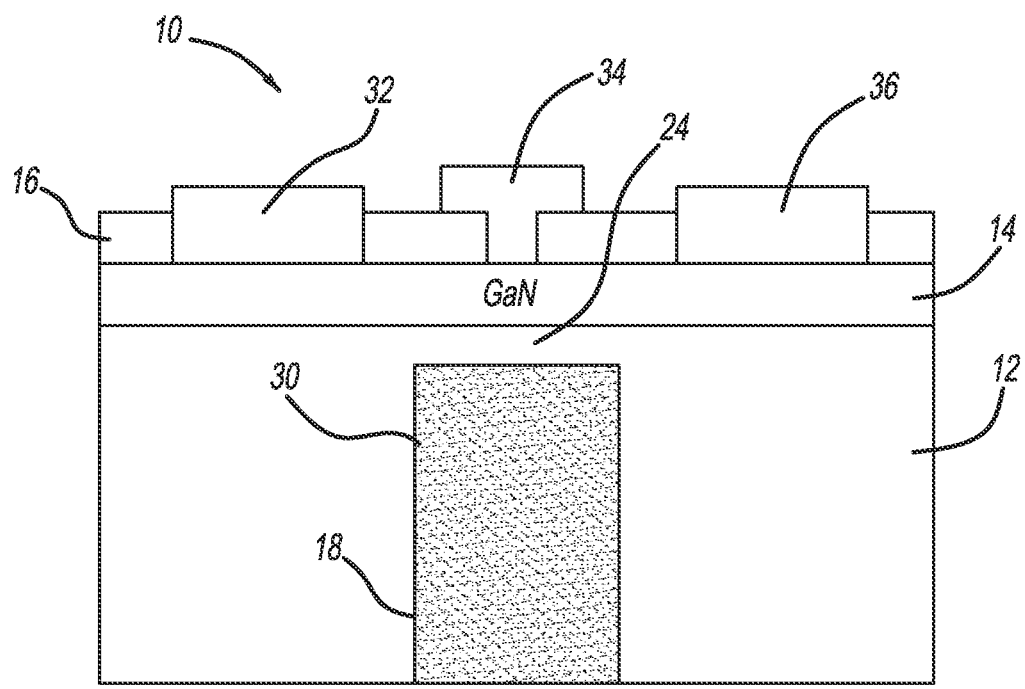

Once the diamond layer 30 is deposited in the via 18, the wafer substrate 12 is then flipped back over so that power transistor components can be fabricated on the GaN layers 14 by first selectively etching away the protective layer 16 and fabricating a source terminal 32, a gate terminal 34 and a drain terminal 36 by know processes, as shown in FIG. 7.

Although the device discussed herein is HEMT device, other types of devices, such as laser diodes or light emitting diodes, that employ GaN device layers deposited on a substrate may benefit from the higher performance provided by the thermally conductive diamond vias discussed herein. Further, although the embodiments discussed herein are specifically for SiC substrates, other suitable substrates, such as those referred to above, may also include formed vias filled with diamond for the same purpose.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for fabricating a semiconductor device, said method comprising:
   providing a semiconductor substrate including a front side and a back-side;
   depositing semiconductor epitaxial layers on the front side of the semiconductor substrate;
   etching at least one thermal via into the back-side of the semiconductor substrate;
   depositing a diamond nucleation seed layer across the entire back-side of the semiconductor substrate so that the diamond nucleation layer is deposited on planar portions of the back-side of the substrate and within the at least one thermal via including sidewalls thereof;
   depositing a mask layer on the diamond nucleation layer;
   removing a portion of the mask layer outside of the thermal via on the planar portions of the back-side of the substrate so that only mask material remains within the thermal via;
   removing a portion of the diamond nucleation layer on the planar portions of the substrate outside of the at least one thermal via;
   removing the remaining portion of the mask material in the thermal via;
   depositing a bulk diamond layer within the thermal via on the remaining portion of the diamond nucleation layer in a manner that only allows diamond to be formed within the thermal via and not on the planar portions of the back-side of the substrate; and
   fabricating device layers on the epitaxial layers.

2. The method according to claim 1 wherein providing a semiconductor substrate includes providing a silicon carbide substrate.

3. The method according to claim 1 wherein depositing epitaxial layers on the substrate includes growing GaN epitaxial layers on the substrate.

4. The method according to claim 1 further comprising depositing a dielectric protective layer on the epitaxial layers before etching the thermal via.

5. The method according to claim 4 wherein depositing the protective layer includes depositing a silicon nitride (SiN) layer, a silicon dioxide ($SiO_2$) layer or combinations thereof.

6. The method according to claim 1 wherein depositing the diamond nucleation seed layer includes depositing a diamond nucleation seed layer to a thickness in the range of 0.1-2 µm.

7. The method according to claim 1 wherein depositing the diamond nucleation seed layer and depositing the bulk diamond layer include depositing a nanocrystalline or a polycrystalline diamond nucleation seed layer.

8. The method according to claim 1 wherein removing a portion of the mask layer includes using a chemo-mechanical polishing process.

9. The method according to claim 1 wherein removing a portion of the diamond seed layer includes using a reactive ion etching with oxygen process.

10. The method according to claim 1 wherein removing a portion of the diamond seed layer includes removing a portion of the diamond layer around a lip of the thermal via so that the diamond seed layer is recessed behind the mask layer.

11. The method according to claim 10 wherein removing a portion of the diamond seed layer around a lip of the thermal via includes using a high temperature oxidation thermal etching process.

12. The method according to claim 10 wherein removing a portion of the diamond seed layer around a lip of the thermal via includes using a different process than removing the diamond seed layer from the planar portions of the back-side of the substrate.

13. The method according to claim 1 further comprising forming a nano-diamond particle layer on the substrate prior to depositing a diamond nucleation seed layer on the substrate.

14. The method according to claim 1 wherein fabricating semiconductor device layers includes aligning the device layers with the thermal via.

15. The method according to claim 1 wherein the semiconductor device is a high electron mobility transistor.

16. A method for fabricating a GaN high electron mobility transistor device, said method comprising:
providing a semiconductor substrate including a front side and a back-side;
forming a nano-diamond particle layer on the substrate;
depositing semiconductor epitaxial layers on the front side of the semiconductor substrate;
etching at least one thermal via into the back-side of the semiconductor substrate;
depositing a diamond nucleation seed layer across the entire back-side of the semiconductor substrate so that the diamond nucleation layer is deposited on planar portions of the back-side of the substrate and within the at least one thermal via including sidewalls thereof;
depositing a mask layer on the diamond nucleation layer;
removing a portion of the mask layer outside of the thermal via on the planar portions of the back-side of the substrate so that only mask material remains within the thermal via;
removing a portion of the diamond nucleation layer on the planar portions of the substrate outside of the at least one thermal via, wherein removing a portion of the diamond seed layer includes removing a portion of the diamond layer around a lip of the thermal via so that the diamond seed layer is recessed behind the mask layer;
removing the remaining portion of the mask material in the thermal via;
depositing a bulk diamond layer within the thermal via on the remaining portion of the diamond nucleation layer in a manner that only allows diamond to be formed within the thermal via and not on the planar portions of the back-side of the substrate; and
fabricating device layers on the epitaxial layers.

17. The method according to claim 16 further comprising depositing a dielectric protective layer on the epitaxial layers before etching the thermal via.

18. The method according to claim 16 wherein depositing the diamond nucleation seed layer includes depositing a diamond nucleation seed layer to a thickness in the range of 0.1-2 µm.

19. The method according to claim 16 wherein depositing the diamond nucleation seed layer and depositing the bulk diamond layer include depositing a nanocrystalline or a polycrystalline diamond nucleation seed layer.

20. A method for fabricating a semiconductor device, said method comprising:
providing a semiconductor substrate including a front side and a back-side;
depositing GaN epitaxial layers on the front side of the semiconductor substrate;
etching at least one thermal via into the back-side of the semiconductor substrate;
depositing a diamond nucleation seed layer across the entire back-side of the semiconductor substrate so that the diamond nucleation layer is deposited on planar portions of the back-side of the substrate and within the at least one thermal via including sidewalls thereof, wherein depositing a diamond nucleation seed layer includes depositing a diamond nucleation seed layer to a thickness in the range of 0.1-2 µm;
depositing a mask layer on the diamond nucleation layer;
removing a portion of the mask layer outside of the thermal via on the planar portions of the back-side of the substrate so that only mask material remains within the thermal via;
removing a portion of the diamond nucleation layer on the planar portions of the substrate outside of the at least one thermal via;
removing the remaining portion of the mask material in the thermal via; and
depositing a bulk diamond layer within the thermal via on the remaining portion of the diamond nucleation layer in a manner that only allows diamond to be formed within the thermal via and not on the planar portions of the back-side of the substrate.

* * * * *